(12) United States Patent
Lin

(10) Patent No.: US 7,138,845 B2
(45) Date of Patent: Nov. 21, 2006

(54) METHOD AND APPARATUS TO SET A TUNING RANGE FOR AN ANALOG DELAY

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/897,166

(22) Filed: Jul. 22, 2004

(65) Prior Publication Data

US 2006/0017480 A1    Jan. 26, 2006

(51) Int. Cl.
*H03H 11/26*    (2006.01)
(52) U.S. Cl. ................................ 327/277; 327/158
(58) Field of Classification Search ............... None
See application file for complete search history.

(56) References Cited

U.S. PATENT DOCUMENTS

| | | | | |
|---|---|---|---|---|
| 6,100,735 | A * | 8/2000 | Lu | 327/158 |
| 6,101,197 | A | 8/2000 | Keeth et al. | |
| 6,242,955 | B1 * | 6/2001 | Shen et al. | 327/158 |
| 6,282,253 | B1 | 8/2001 | Fahrenbruch | |
| 6,392,456 | B1 | 5/2002 | Pyeon et al. | |
| 6,445,231 | B1 * | 9/2002 | Baker et al. | 327/158 |
| 6,518,807 | B1 * | 2/2003 | Cho | 327/158 |
| 6,539,072 | B1 | 3/2003 | Donnelly et al. | |
| 6,559,699 | B1 * | 5/2003 | Lee et al. | 327/276 |
| 6,628,154 | B1 * | 9/2003 | Fiscus | 327/158 |
| 6,731,147 | B1 * | 5/2004 | Fiscus | 327/158 |
| 6,765,976 | B1 * | 7/2004 | Oh | 375/376 |
| 6,868,504 | B1 * | 3/2005 | Lin | 713/500 |
| 6,937,076 | B1 * | 8/2005 | Gomm | 327/158 |
| 2002/0101292 | A1 | 8/2002 | Maneatis | |
| 2002/0172314 | A1 | 11/2002 | Lin et al. | |
| 2004/0125905 | A1 | 7/2004 | Vlasenko et al. | |

FOREIGN PATENT DOCUMENTS

EP    1 282 229 A1    2/2003

OTHER PUBLICATIONS

John G. Maneatis, "Low-Jitter Process-Independent DLL and PLL Based on Self-Biased Techniques", IEEE Journal of Solid-State Circuits, vol. 31, No. 11, Nov. 1996, pp. 1723-1732.
Moon et al., "An All-Analog Multiphase Delay-Locked Loop Using a Replica Delay Line for Wide-Range Operation and Low-Jitter Performance", IEEE Journal of Solid-State Circuits, vol. 35, No. 3, Mar. 2000, pp. 377-384.
International Search Report dated Nov. 2, 2005 (4 pages).
Written Opinion of the International Searching Authority dated Nov. 2, 2005 (7 pages).

\* cited by examiner

*Primary Examiner*—Timothy P. Callahan
*Assistant Examiner*—Cassandra Cox
(74) *Attorney, Agent, or Firm*—TraskBritt

(57) ABSTRACT

An apparatus and method for an analog fine delay line, a hybrid delay line, and a delay locked loop (DLL) is described. In the DLL, a coarse phase detector compares a reference signal and feedback signal in controlling coarse phase adjustment signals indicating whether a delay of a coarse delay line should be increased or decreased. Similarly, a fine phase detector compares the reference signal and feedback signal to generate a locking bias signal, which may increase or decrease a delay of an analog fine delay line. The analog fine delay line and coarse delay line may be connected in series creating the hybrid delay line having a total delay comprised of the coarse delay and the fine delay. Additionally, a fine bias generator may control the fine delay in response to an initiating bias signal from an analog phase generator or the locking bias signal.

73 Claims, 4 Drawing Sheets

METHOD AND APPARATUS TO SET A TUNING RANGE FOR AN ANALOG DELAY

BACKGROUND OF THE INVENTION

1. Field of the Invention

This invention relates generally to mixed delay lines, and particularly to analog delay circuits and methods for setting a tuning range of the analog delay circuits.

2. Description of Related Art

In modern high frequency integrated circuits, it is often necessary to generate internal clocks with predetermined phase relationships to a reference clock. Conventionally, a Phase Locked Loop (PLL) or Delay Locked Loop (DLL) has been used to generate this predetermined phase relationship. A variety of reasons may exist for requiring the phase relationship. For example, it may be desirable to adjust an internal clock relative to a reference clock to minimize delay between the reference clock and output signals controlled by the internal clock. In another example, it may be desirable to minimize skew or eliminate delay between the reference clock and an internal clock buffered by a large internal clock tree. A PLL or DLL may be implemented to reduce or eliminate delay between the reference clock and the final branches of the internal clock tree. In yet another example, it may be desirable to create a phase splitter to generate phase-shifted clocks, for example at phase delays of 90, 180, 270, and 360 degrees relative to the reference clock. These phase delayed clocks are often used for circuits that perform different operations during different phases of the clock cycle.

DLLs are conventionally all digital, all analog, or some form of digital/analog hybrid. Digital DLLs include a delay line of digital elements with discrete delays. A phase detector compares the reference signal and a feedback signal to determine whether more discrete delays should be added to the delay line, increasing the overall delay, or discrete delay elements should be removed from the delay line, decreasing the overall delay. Digital DLLs have the advantage of a wide locking range and ability to achieve phase lock between the reference clock and feedback signal in a relatively short lock time. However, they have the disadvantage of pronounced jitter in the output clock or an undesired skew between the feedback clock and the reference clock due to the availability of only discrete time adjustments in increments of the delay through a single delay element.

Analog DLLs conventionally contain delay elements that may be adjusted by modifying a bias voltage controlling the delay elements. Similar to the digital DLL, an analog DLL includes a phase detector. However, the result of the phase comparison is a bias voltage, which may move up or down. The bias voltage controls the voltage swing of the analog delay elements and, as a result, the delay through the analog delay line. Analog DLLs have the advantage of generating a continuously variable delay, which creates smooth (i.e., continuous as opposed to discrete) clock period adjustments and relatively low phase jitter. However, Analog DLLs have a relatively narrow locking range and relatively long lock time compared to digital DLLs.

Hybrid analog/digital DLLs attempt to incorporate the advantages from both digital DLLs and analog DLLs. Hybrid DLLs may take on many alternate forms. However, hybrid DLLs may be generally considered as either a digital delay line in series with an analog delay line or an analog delay line with selectable taps at the output of each of the analog delay elements. Hybrid DLLs conventionally use the coarse digital elements to achieve an initial lock to the reference clock, while fine adjustments within the delay time of a discrete digital element may be performed by modifying the delay time through the analog delay elements.

However, analog fine adjustment may contain its own set of tuning problems. Conventionally, it has not been possible, using analog delay lines, to adjust across all operational corners of variations in Process, Voltage, Temperature, and Frequency of the output clock (PVTF). An analog delay line tends to integrate at slow corners (i.e., slow process, low voltage, high temperature) and high clock frequencies. As a result, the bias voltage must be adjusted to compensate. On the other hand, at the fastest corner (i.e., fast process, high voltage, and low temperature) and low clock frequency, the bias voltage must be adjusted in the opposite direction in order to provide adequate tuning range. If the bias voltage for the fine tuning is not set initially at a value allowing substantial tuning range in both directions, coarse digital corrections may be required introducing undesired jitter.

There is a need for a hybrid DLL using an analog delay line for fine tuning, wherein an initiating bias voltage may be established to allow a substantial fine tuning range by adapting to differences in operational PVTF parameters. Additionally, there is a need for a means for adjusting between establishing the initiating bias signal and maintaining a bias signal responsive to changes in the reference clock in order to maintain a phase lock in the hybrid DLL.

BRIEF SUMMARY OF THE INVENTION

An embodiment of the present invention comprises an adjustable analog delay line and method of generating an analog delay. The adjustable analog delay line includes an analog phase generator, a fine bias generator, and a fine delay line. The fine delay line may be configured to generate a delay with a fine delay magnitude between a fine delay input and a delayed output. At least one fine bias signal may be used to control the fine delay magnitude of the fine delay line. Generation of the fine bias signal may be controlled by the fine bias generator. The fine bias generator may be responsive to an initiating bias signal related to a bias signal from the analog phase generator. This initiating bias signal may be used to enable a substantial fine tuning range for the fine delay line. In some embodiments, the fine tuning range may be established in response to operating parameters of supply voltage, temperature, and frequency. The fine bias signal may alternatively be responsive to an operating bias signal. In some embodiments, a fine phase detector comparing a reference signal and a feedback signal may generate the operating bias signal.

Another embodiment of the present invention comprises a hybrid delay line and method of generating a hybrid delay. The hybrid delay line comprises a coarse delay line, the analog phase generator, the fine delay line, and the fine bias generator. The coarse delay line has a coarse delay magnitude, which may be related to at least one coarse phase adjustment signal. In this embodiment, the coarse delay line may be connected in series with the fine delay line creating the hybrid delay line. In some embodiments, the at least one coarse phase adjustment signal may be controlled by a coarse phase detector configured for comparing the reference signal and the feedback signal. Operation of the fine delay line and fine bias generator in the hybrid delay line embodiment is similar to the previously described adjustable analog delay line embodiment.

Another embodiment of the present invention comprises a DLL and a method of generating a delayed output phase locked to a reference signal. The DLL includes the analog phase generator, a coarse loop, and a fine loop. The fine loop includes a fine phase detector, the fine bias generator, and the fine delay line. A fine delay magnitude through the fine delay line may be controlled by at least one fine bias signal, which may be generated by the fine bias generator in response to either an initiating bias signal or an operating bias signal. As described above for the adjustable analog delay line embodiment, the initiating bias signal may be generated by the analog phase generator. On the other hand, the operating bias signal may be generated as a result of a comparison between the reference signal and the feedback signal in the fine phase detector to determine whether the fine delay magnitude should be increased or decreased. The coarse loop includes a coarse phase detector, a coarse delay line, and the fine delay line connected in series with the coarse delay line. Delay through the coarse delay line may be controlled by at least one coarse phase adjustment signal, which may be generated by the coarse phase detector performing a comparison of the reference signal and a feedback signal to determine whether a coarse delay magnitude should be increased or decreased. A feedback path closes the coarse loop and fine loop by connecting the delayed output to the feedback signal. In some embodiments, the feedback path may also include a buffer replica for emulating the delay of other circuitry on a semiconductor device.

Another embodiment of the present invention comprises a method of achieving and maintaining phase lock in a hybrid DLL clock system. First, the analog phase generator may acquire a phase lock to an input signal, which has a phase relationship to the reference signal, by adjusting a phase generator bias signal, which in turn may adjust the delay magnitude of the analog phase generator. The phase generator bias signal, or a buffered version, may be used to generate an initiating bias signal for the fine delay line. With the initiating bias signal setting an initial fine delay magnitude in the fine delay line, a coarse phase lock may be acquired by adjusting the coarse delay magnitude in response to a comparison of the reference signal and feedback signal in the coarse phase detector. Once a coarse phase lock is acquired, the fine phase detector and fine delay line may be enabled to maintain a fine phase lock. The fine phase detector compares the reference signal and feedback signal to generate an operating bias signal, which the fine bias generator may use to control the fine delay magnitude in the fine delay line.

Another embodiment of the present invention comprises a semiconductor device including at least one adjustable analog delay line according to the invention described herein.

Another embodiment of the present invention includes a plurality of semiconductor memories incorporating an adjustable analog delay line according to the present invention fabricated on a semiconductor wafer.

Yet another embodiment, in accordance with the present invention comprises an electronic system including an input device, an output device, a processor, and a memory device. The memory device comprises at least one semiconductor memory incorporating an adjustable analog delay line according to the present invention.

BRIEF DESCRIPTION OF THE DRAWINGS

In the drawings, which illustrate what is currently considered to be the best mode for carrying out the invention.

DETAILED DESCRIPTION OF THE INVENTION

In the following description, circuits and functions may be shown in block diagram form in order not to obscure the present invention in unnecessary detail. Conversely, specific circuit implementations shown and described are exemplary only, and should not be construed as the only way to implement the present invention unless specified otherwise herein. Additionally, block definitions and partitioning of logic between various blocks is exemplary of a specific implementation. It will be obvious to one of ordinary skill in the art that the present invention may be practiced by numerous other partitioning solutions. For the most part, details concerning timing considerations and the like have been omitted inasmuch as such details are not necessary to obtain a complete understanding of the present invention and are within the abilities of persons of ordinary skill in the relevant art.

The term "bus" is used to refer to a plurality of signals or conductors, which may be used to transfer one or more various types of information, such as data, addresses, control, or status. Additionally, a bus or collection of signals may be referred to in the singular as a signal. The terms "assert" and "negate" are respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one.

When using an analog delay line, selecting a starting point for a bias signal controlling the amount of delay in the analog delay line may be problematic. Arbitrary selection of a bias point may not take into account operational variations of process, temperature, voltage, and frequency of the signal being delayed. The present invention develops a starting bias signal (also referred to as an initiating bias signal) to account for these operational variations and create a starting point, or "sweet spot," allowing a substantial fine tuning range above and below the initiation point when the analog delay line switches to normal operation. To explain the present invention, it is described, in the context of a hybrid DLL system, as an exemplary use.

Figure 1:
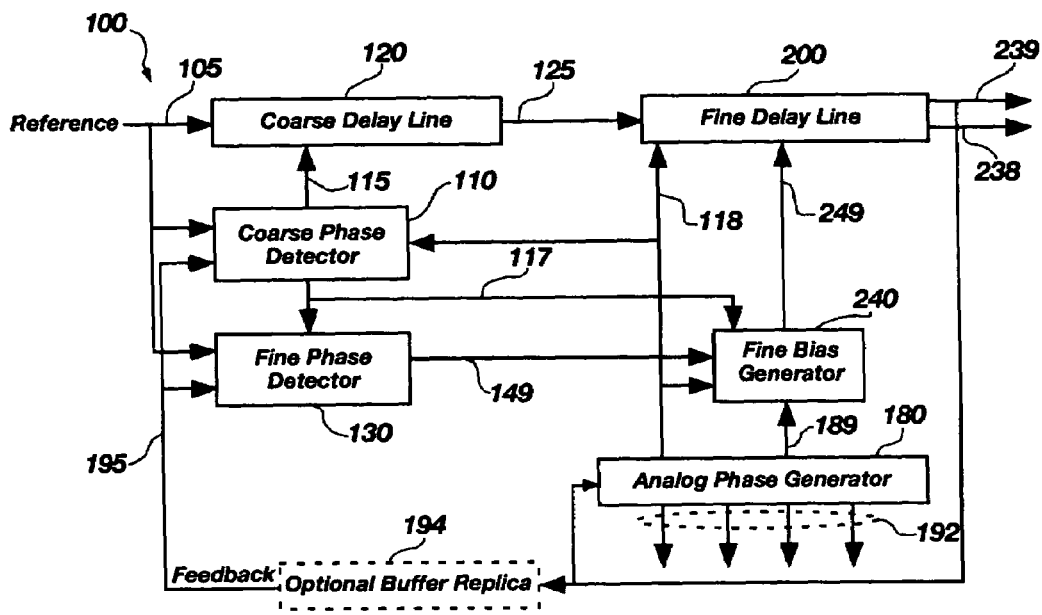
FIG. 1 is a block diagram of an exemplary DLL including, among other things, a fine delay line, a fine bias generator, and a coarse delay line.

FIG. 1 shows a block diagram of a complete hybrid DLL 100. Basic operation of the full DLL 100 will be described before describing details of the individual elements. A reference signal 105 connects to a coarse delay line 120, a coarse phase detector 110, and a fine phase detector 130. A coarse delay output 125 from the coarse delay line 120 connects to an input of the fine delay line 200. The fine delay line 200 may generate a delayed output 239 and an inverted delayed output 238. In some applications, the inverted delayed output 238 may not be needed and, therefore, may be optional. The delayed output 239 may connect to a feedback signal 195, or to an optional buffer replica 194. The feedback signal 195 connects to the coarse phase detector 110 and the fine phase detector 130. The buffer replica 194 may be implemented to emulate other circuitry on a semiconductor device by creating a delay representative of the other circuitry. Examples of this other circuitry to be emulated include a clock tree, an output buffer, and an output buffer in combination with an input buffer. Yet even more circuits may be emulated depending on the reason for, and application of, the DLL 100. Additionally, rather than create a buffer replica 194, in some implementations the other circuitry itself may be placed in the feedback loop in the position of the buffer replica 194. Also shown in FIG. 1 is an analog phase generator 180. The analog phase generator 180 may provide a phase generator bias signal 189 to the fine bias generator 240 as is explained more fully below.

A coarse loop may be closed by the coarse phase detector 110 comparing the reference signal 105 and the feedback signal 195 to generate at least one coarse phase adjustment signal 115, which controls the coarse delay magnitude in the coarse delay line 120.

A fine loop may be closed by the fine phase detector 130 comparing the reference signal 105 and feedback signal 195 to generate an operating bias signal 149, which may be used by the fine bias generator 240 to control at least one fine bias signal 249, which may set the fine delay magnitude of the fine delay line 200.

The exemplary coarse phase detector 110 and exemplary coarse delay line 120 are not shown in more detail than that of FIG. 1. However, the basic operation is briefly described. Conventionally, a digital coarse phase detector 110 includes a coarse phase comparator for comparing clock edges of the reference signal 105 and feedback signal 195. Depending on the application, this phase comparison may be performed on rising edges, falling edges, or both edges of the two signals (105 and 195). The phase comparison examines the phase difference between the reference signal 105 and feedback signal 195 to determine whether the delay magnitude of the buffered output should be increased, decreased, or held the same, in an attempt to bring the reference signal 105 and feedback signal 195 into closer alignment. The coarse phase detector 110 may generate at least one coarse phase adjustment signal 115 indicating how the coarse delay magnitude should be changed.

For example, perhaps the coarse delay line 120 includes 20 selectable delay taps and the currently selected delay tap is 14. The coarse phase detector 110 may compare the rising edges of the reference signal 105 and feedback signal 195 and determine that the feedback signal 195 leads the reference signal 105. As a result, the coarse delay magnitude may need more delay. Accordingly, the coarse phase detector 110 may use the at least one coarse phase adjustment signal 115 to indicate a selection of delay tap 15. Ultimately, the loop may reach an equilibrium point where the compared edges of the reference signal 105 and feedback signal 195 are substantially aligned and the coarse loop is considered phase locked.

Unfortunately, due to the discrete time delays available from the various delay taps, the coarse loop may bounce back and forth between two adjacent taps because the compared edges are not precisely aligned, causing jitter in the resulting delayed output 239. Additionally, the coarse loop may lock onto one delay tap but an undesired skew will exist between the reference signal 105 and the feedback signal 195. Of course, the coarse delay line 120 and coarse phase detector 110 are one exemplary implementation. The present invention may be practiced in a variety of other implementations including other types of coarse delay. For example, the coarse delay output 125 may be generated as a result of other implementations such as a synchronous mirror delay. Also, the coarse delay line may be implemented in multiple stages including its own coarse and fine delay adjustments within the coarse delay line.

Figure 2:
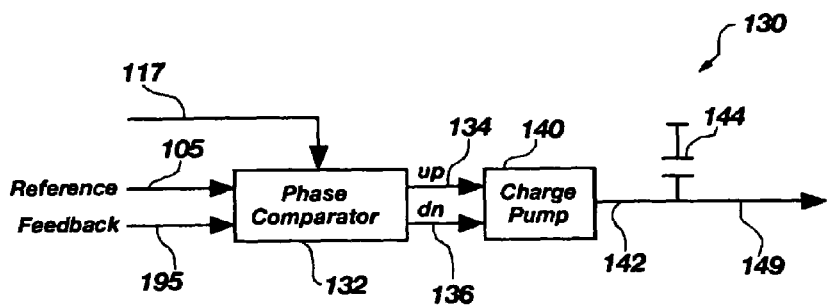
FIG. 2 is a block diagram of an exemplary fine phase detector.

Implementing a fine loop, including an analog fine delay line 200 in series with the coarse delay line 120, may fine tune the delayed output 239 to a more precise match between the reference signal 105 and feedback signal 195, substantially eliminating the potential jitter and skew from the coarse loop. The fine phase detector 130 portion of the fine loop is shown in FIG. 2. A phase comparator 132 may perform a phase comparison similar to that performed by the coarse phase detector 110. However, the phase comparator 132 in the fine phase detector 130 may generate an up pulse 134 and a down pulse 136 rather than the coarse phase adjustment signals 115. Depending on the comparison, an up pulse 134, a down pulse 136, both pulses, or neither pulse may be generated. The up pulse 134 and down pulse 136, may be used by a charge pump 140 to control a fine phase adjustment signal 142. The fine phase adjustment signal 142 is a bias signal with a voltage level that may be proportional to the desired fine delay magnitude through the fine delay line 200. The charge pump 140 may use the up pulse 134 and down pulse 136 to move this voltage level of the fine phase adjustment signal 142 up or down. A loop filter 144 may be used to generate an operating bias signal 149 by integrating the fine phase adjustment signal 142 to produce the operating bias signal 149 and ensure a first order closed loop response for the fine loop. The fine bias generator 240 may buffer the operating bias signal 149 to create at least one fine bias signal 249 for controlling the fine delay magnitude of the fine delay line 200.

For example, if the feedback signal 195 lagged the reference signal 105, delay may need to be removed from the fine delay line 200. The fine phase detector 130, detecting this edge misalignment between the feedback signal 195 and reference signal 105, may generate a down pulse 136. The charge pump 140 may use the down pulse 136 to lower the voltage level of the fine phase adjustment signal 142 proportionally, which in turn may be filtered and smoothed by the loop filter 144 to generate the operating bias signal 149. The fine bias generator 240, in response to a lower operating bias signal 149, may adjust the at least one fine bias signal 249, causing the fine delay line 200 to proportionally reduce the fine delay magnitude.

Figure 3:
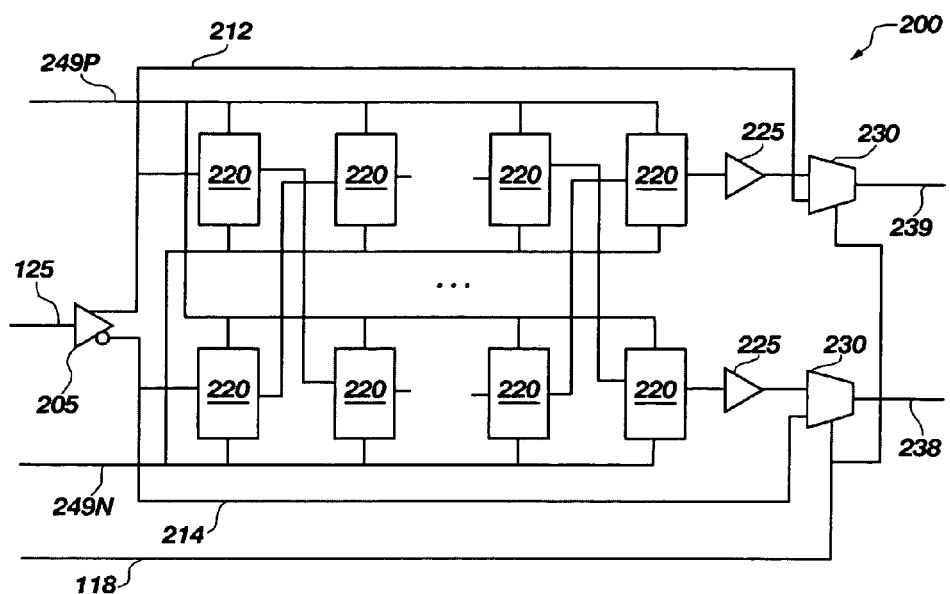
FIG. 3 is a block diagram of an exemplary fine delay line.

The fine delay line 200 is shown in more detail in FIG. 3. A clock splitter 205 receives the coarse delay output 125 to generate a clock signal 212 and an inverted clock signal 214. The clock signal 212 and inverted clock signal 214 propagate through a series of differential buffers 220. This series of differential buffers 220 also may be referred to as a Voltage Controlled Delay Line (VCDL). After passing through the differential buffers 220, level shifters 225 return the delayed clock and inverted delayed clock to typical CMOS levels for use by other CMOS circuits. The number of differential buffers in a VCDL may vary depending on how much fine delay magnitude is required of the fine delay line 200. Implementing a large number of buffers will allow a wide fine tuning range such that the fine delay line 200 may be able to compensate for large variations in frequency, process, voltage, and temperature variations. On the other hand, additional differential buffers 220 will require more area on the semiconductor die in addition to consuming more power.

Design and implementation of the VCDL may be application dependent. FIG. 3 shows one exemplary implementation. In the FIG. 3 implementation, a p-channel fine bias signal 249P and an n-channel fine bias signal 249N are inputs to each differential buffer 220. These fine bias signals (249N and 249P) adjust the delay through each differential buffer 220 by adjusting the voltage level on the fine bias signals (249N and 249P). Other differential buffers 220 may be implemented that only require an n-channel fine bias signal 249N or only require a p-channel fine bias signal 249P.

A pair of multiplexers 230, connected to the delayed output 239 and the inverted delayed output 238, provide a bypass mechanism for eliminating the variable delay of the VCDL if needed. The bypass mechanism may select the clock signal 212 and inverted clock signal 214 if a loop enable signal 118 is negated or may select the delayed clock and delayed inverted clock from the VCDL if the loop enable signal 118 is asserted.

Figure 4:
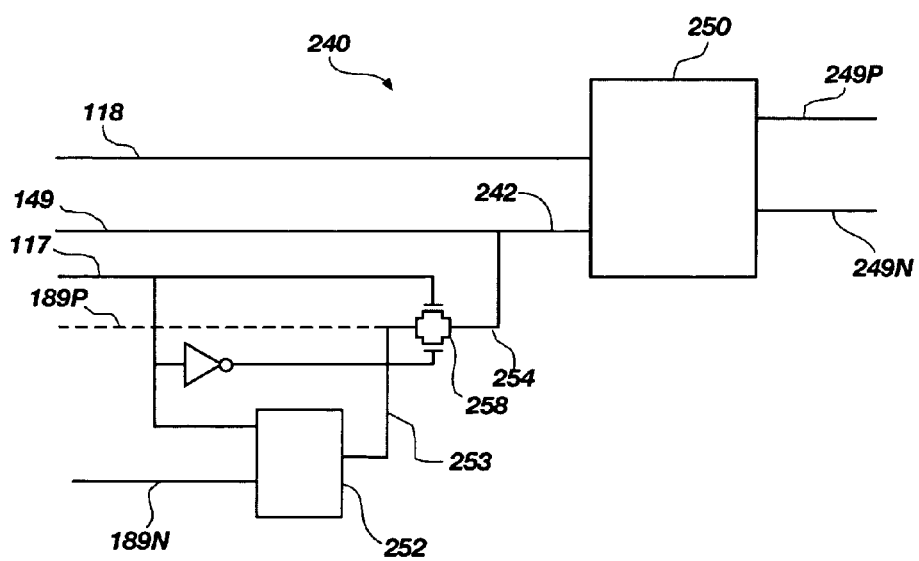
FIG. 4 is a block diagram of an exemplary fine bias generator.

The fine bias generator 240, shown in FIG. 4, may include a fine bias buffer 250 to control the at least one fine bias signal 249 comprised of the n-channel fine bias signal 249N and the p-channel fine bias signal 249P. The fine bias buffer 250 may continually adjust the n-channel fine bias signal 249N and p-channel fine bias signal 249P in response to voltage changes on a bias input 242. In adjusting the fine bias signals 249, the fine bias buffer 250 controls the voltage swing, and as a result, the delay, of the differential buffers 220 in the fine delay line 200. The fine bias buffer 250 may accept the bias input 242 from either an initiating bias signal 254 or an operating bias signal 149, which is explained more fully below. Additionally, the loop enable signal 118, when negated, may be used to disable the fine bias buffer 250 and drive the p-channel fine bias signal 249P and n-channel fine bias signal 249N close to the rails of Vcc and Vss respectively so that the fine delay line 200 does not draw unnecessary current when the loop enable signal is negated.

In some implementations, the fine bias generator 240 may adjust the at least one fine bias signal 249 by using a self-biasing technique that establishes a relatively constant current through the differential buffers 220 of the fine delay line 200. In addition, many self biasing techniques may keep the current relatively constant in a manner that is substantially independent of supply voltage variations. Further, as stated earlier, the VCDL may require only the p-channel fine bias signal 249P or may require only the n-channel fine bias signal 249N. An additional function in many implementations of the fine bias generator 240 is to reduce or eliminate capacitive coupling between the fine bias signal 249 and the signal determining the bias setting, which may be in the form of the phase generator N-bias signal 189N, the phase generator P-bias signal 189P, or the operating bias signal 149.

Figure 5:
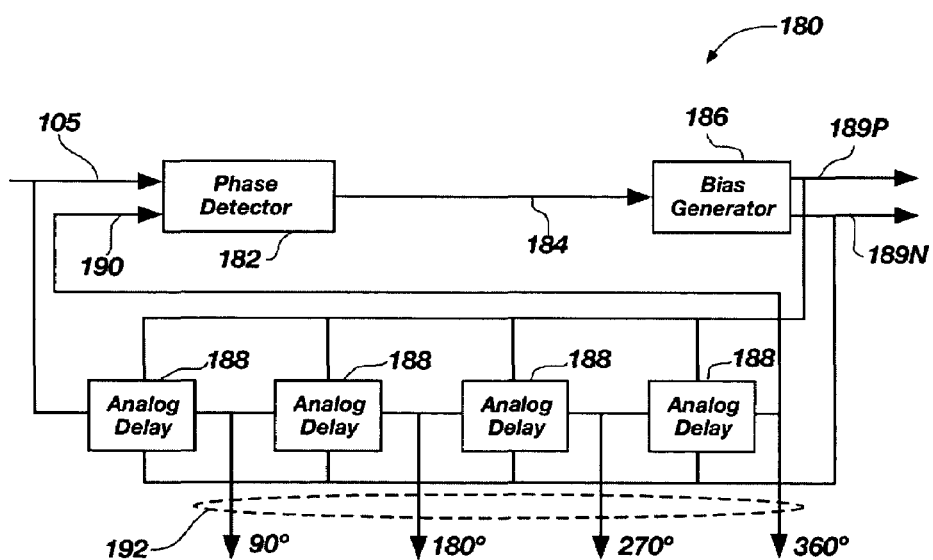
FIG. 5 is a block diagram of an exemplary analog phase generator.

The initiating bias signal 254 may be generated by the analog phase generator 180. An exemplary analog phase generator 180, as shown in FIG. 5, may be a complete DLL with its own feedback mechanism. The conventional function of a phase generator is to develop a set of multi-phase signals 192 with a desired phase relationship to an input clock. The analog phase generator 180 includes a phase detector 182, and a bias generator 186 similar to those described above for the fine delay line 200. The analog phase generator 180 also includes analog delay elements 188 including differential buffer elements similar to those described for the fine delay line 200. The phase detector 182 compares the input clock to a phase generator feedback signal 190 to generate a phase generator adjustment signal 184. The bias generator 186 uses the phase generator adjustment signal 184 to generate the phase generator bias signals (189P and 189N). In this exemplary embodiment, the analog phase generator 180 includes four equal sized analog delays such that the multi-phase signals 192 are generated at 90, 180, 270, and 360 degrees relative to the input clock. Many other phase relationships may be desirable and implemented depending on the application. The 360 degree multi-phase signal represents one full clock period, which may be fed back to the phase detector 182 for comparison to the input clock.

In the embodiment shown in FIG. 1, the input clock of the analog phase generator 180 is connected to the delayed output 239. However, many other connection points are possible within the scope of the present invention. For example, for the embodiment shown in FIG. 1, the input to the analog phase generator 180 may be connected to the inverted delayed output 238, the feedback signal 195, or the reference signal 105.

When the analog phase generator 180 achieves phase lock, the phase generator N-bias signal 189N and phase generator P-bias signal 189P represent bias voltage levels where the analog delays are tuned for the current operating parameters of voltage, temperature, and frequency variations. As such, they may represent a desirable initiating bias signal 254 for the fine delay line 200 of FIG. 3 because the analog delay elements 188 of the analog phase generator 180 are similar to the differential buffers 220 of the fine delay line 200. Of course, some implementation differences between the analog delay elements 188 of the analog phase generator 180 and the fine delay line 200 are possible. For example, there may be no need to include in the analog delay elements 188, elements such as the clock splitter 205, level shifters 225, and multiplexers 230 of the fine delay line 200.

Returning to FIG. 4, as stated earlier, the bias input 242 to the fine bias buffer 250 may be selected from either the operating bias signal 149 or the initiating bias signal 254. A multiplexer 258 may select the initiating bias signal 254 for the bias input 242 when a fine lock enable signal 117 is negated or select the operating bias signal 149 for the bias input 242 when the fine lock enable signal 117 is asserted.

The initiating bias signal 254 may be optionally coupled to the phase generator P-bias signal 189P (shown as a dashed line in FIG. 4). Alternatively, the initiating bias signal 254 may be coupled to an output 253 of a bias adapter 252, which may be tunable to adjust the initiating bias signal 254. The bias adapter 252 accepts the phase generator N-bias signal 189N to buffer it and create the initiating bias signal 254 at a p-channel bias level, rather than the n-channel bias level of the phase generator N-bias signal 189N. Buffering the phase generator N-bias signal 189N may provide isolation from potential capacitive coupling between the analog phase generator 180 and the fine bias generator 240.

Figure 4A:
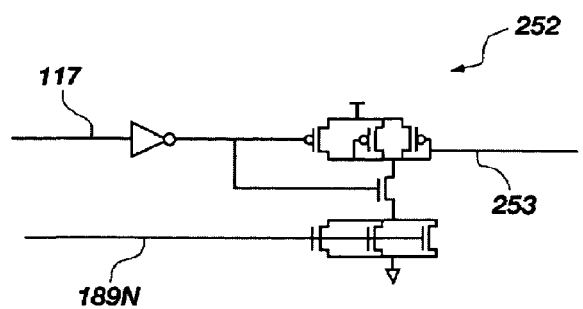
FIG. 4A is a block diagram of an exemplary bias adapter that may be used in the fine bias generator.

FIG. 4A illustrates an exemplary implementation of a bias adapter 252 according to the present invention. It should be readily apparent to those skilled in the art that other implementations of a bias adapter 252 are possible. For example, it may be advantageous to design an alternate fine bias buffer (not shown) that accepts an n-channel bias level rather than a p-channel bias level. In this case, the bias adapter 252 may be designed to convert a p-channel bias level from the analog phase generator 180 to an n-channel bias level appropriate for the alternate fine bias buffer. Additionally, the bias adapter 252 may be reconfigurable using programmable elements (not shown) such as fuses, flash memory, EPROM, or EEPROM to adjust for differences in circuit topologies and enable refining of the initiating bias signal relative to the phase generator N-bias signal 189N. Reconfiguring the bias adaptor 252 may enable developing an initiating bias signal with a more optimum fine tuning range. This reconfigurability may be accomplished, for example, by modifying the size, number, or size and number of n-channel transistors connected to the phase generator N-bias signal. Of course, other methods of reconfiguring the bias adapter will be readily apparent to those skilled in the art.

In operation, achieving phase lock in the DLL 100 may proceed as follows. First, phase locking in the fine loop and the coarse loop may be disabled, and the fine delay line 200 bypassed, by negating the loop enable signal 118. In FIG. 1, the loop enable signal 118 is shown emerging from the analog phase generator 180. However, it may just as easily be generated by one of the other functional blocks or a state machine (not shown) controlling the phase locking process. With the coarse loop and fine loop disabled, the analog phase generator 180 may achieve a phase lock without the added complexity of perturbations to its input clock.

When the analog phase generator 180 achieves phase lock, the phase generator bias signals (189P and 189N) may be used by the fine bias generator 240 as an initiating bias signal 254. This initiating bias signal 254 represents a preferable initiation point for the fine delay magnitude of the fine delay line 200 that may provide a substantial fine tuning range above and below the initiation point that is also compensated for the present operation parameters of process, voltage, temperature, and frequency.

With the initiation point and fine tuning range set, the coarse loop may be enabled to phase lock to the reference signal 105 by asserting the loop enable signal 118. The assertion of the loop enable signal 118 may also remove the bypass from the fine delay line 200 so that the fine delay magnitude set by the initiating bias signal 254 may participate in the overall delay of the coarse loop. Once the coarse loop is phase locked, the fine loop may be enabled by asserting the fine lock enable signal 117. With the fine loop enabled, the fine bias generator 240 may use the operating bias signal 149 generated by the fine phase detector 130 rather than the initiating bias signal 254 derived from the analog phase generator 180. At this point, the fine loop may generate continuously variable fine adjustments to the fine delay magnitude to compensate for any variations in process, voltage, temperature, frequency of the reference clock. Generally, in DLLs containing a coarse delay and a fine delay, once the coarse loop is phase locked further modification to the coarse loop is disabled to avoid a potentially large jitter in the final delay output. Further modifications to the delayed output may be accomplished with the fine delay line. An analog fine delay line may be desirable over a digital fine delay line because analog fine delay lines can make fine adjustments quicker resulting in a faster lock and response time. Additionally, because the analog adjustments are continuous, discrete jitter, which may be caused by a digital fine delay line, may be eliminated.

As stated earlier, the fine tuning range possible in the fine delay line 200 may depend on the number of differential buffers 220 used in series. For example, the fine delay line 200 may be configured such that at a maximum delay it may be able to provide a delay of about ½ of the reference signal's 105 period (Tck). In that configuration, the initiating bias signal 254 may set an initial delay for the fine delay line 200, depending on the operating parameters, somewhere near the midpoint, or about ¼ Tck. In this configuration, the fine delay line 200 may support a tuning range between ½ Tck and the minimum delay of the fine delay line 200.

Figure 6:
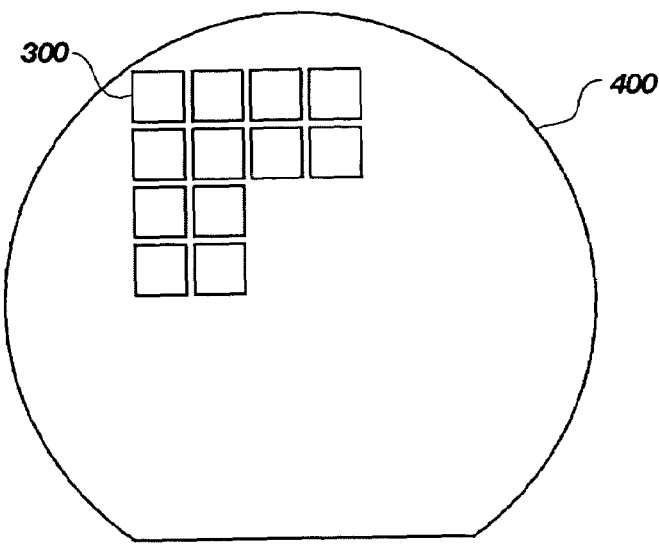
FIG. 6 is a semiconductor wafer including a plurality of semiconductor devices including a delay line according to the present invention.

As shown in FIG. 6, a semiconductor wafer 400, in accordance with the present invention, includes a plurality of semiconductor devices 300 incorporating the adjustable analog delay line described herein. Of course, it should be understood that the semiconductor devices 300 may be fabricated on substrates other than a silicon wafer, such as, for example, a Silicon On Insulator (SOI) substrate, such as, for example, a Silicon On Glass (SOG) substrate, or a Silicon On Sapphire (SOS) substrate, a gallium arsenide wafer, an indium phosphide wafer, or other bulk semiconductor substrate. As used herein, the term "wafer" includes and encompasses all such substrates.

Figure 7:
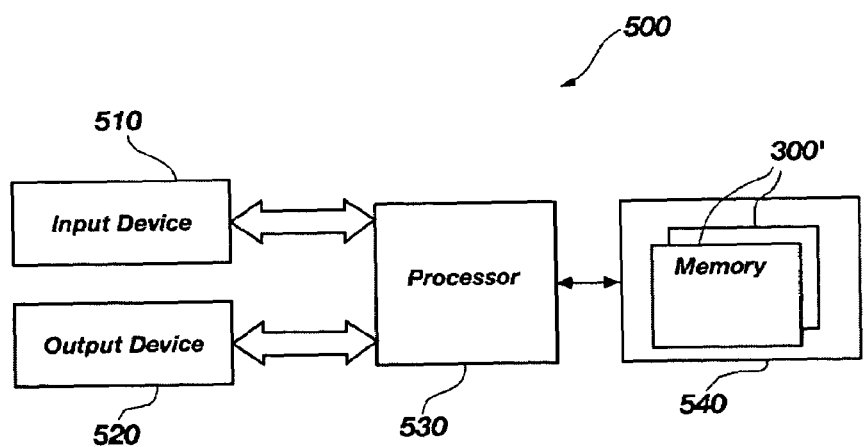
FIG. 7 is an electronic system diagram showing a plurality of semiconductor memories including a delay line according to the present invention.

As shown in FIG. 7, an electronic system 500, in accordance with the present invention, comprises an input device 510, an output device 520, a processor 530, and a memory device 540. The memory device 540 comprises at least one semiconductor memory 300' incorporating the adjustable analog delay line described herein in a DRAM device. It should be understood that the semiconductor memory 300' may comprise a wide variety of devices other than, or in addition to, a DRAM, including, for example, Static RAM (SRAM) devices, and Flash memory devices.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. An adjustable analog delay line, comprising:
   a fine bias generator configured to control at least one fine bias signal, wherein the fine bias generator is responsive to either an initiating bias signal related to a phase generator bias signal from an analog phase generator or an operating bias signal;
   a bias adapter operably coupled to the phase generator bias signal and configured to generate the initiating bias signal; and
   a fine delay line including a fine delay input and a delayed output, wherein the fine delay line is configured to delay the delayed output relative to the fine delay input by a fine delay magnitude related to the at least one fine bias signal.

2. The adjustable analog delay line of claim 1, wherein the phase generator bias signal, having a P-channel bias level, operably couples to the initiating bias signal.

3. The adjustable analog delay line of claim 2, wherein the analog phase generator is configured to modify the initiating bias signal to establish a substantial tuning range for the fine delay line at the operating parameters of supply voltage, temperature, and frequency.

4. The adjustable analog delay line of claim 1, wherein the bias adapter is configured to modify the initiating bias signal to establish a substantial tuning range for the fine delay line at operating parameters of supply voltage, temperature, and frequency.

5. The adjustable analog delay line of claim 1, wherein the phase generator bias signal comprises an N-channel bias level and the initiating bias signal comprises a P-channel bias level.

6. The adjustable analog delay line of claim 1, further comprising a fine phase detector configured to compare a feedback signal and a reference signal to generate the operating bias signal indicating whether the fine delay magnitude should be increased or decreased.

7. The adjustable analog delay line of claim 6, wherein the fine phase detector further comprises a loop filter configured to generate the operating bias signal by filtering a fine phase adjustment signal from the fine phase detector.

8. The adjustable analog delay line of claim 1, wherein the fine bias generator is configured to be enabled when a loop enable signal is asserted.

9. The adjustable analog delay line of claim 1, wherein the fine delay line is configured to be bypassed when a loop enable signal is negated.

10. The adjustable analog delay line of claim 1, wherein the fine bias generator is responsive to the initiating bias signal when a fine lock enable signal is negated and responsive to the operating bias signal when the fine lock enable signal is asserted.

11. An adjustable hybrid delay line, comprising:
a coarse delay line operably coupled to a reference signal and configured to delay a coarse delay output relative to the reference signal by a coarse delay magnitude related to at least one coarse phase adjustment signal;
a fine bias generator configured to control at least one fine bias signal, wherein the fine bias generator is responsive to either an initiating bias signal related to a phase generator bias signal from an analog phase generator or an operating bias signal;
a bias adapter operably coupled to the phase generator bias signal and configured to generate the initiating bias signal; and
a fine delay line operably coupled to the coarse delay output and configured to delay a delayed output relative to the coarse delay output by a fine delay magnitude related to the at least one fine bias signal.

12. The adjustable hybrid delay line of claim 11, wherein the phase generator bias signal, having a P-channel bias level, operably couples to the initiating bias signal.

13. The adjustable hybrid delay line of claim 12, wherein the analog phase generator is configured to modify the initiating bias signal to establish a substantial tuning range for the fine delay line at operating parameters of supply voltage, temperature, and frequency.

14. The adjustable hybrid delay line of claim 11, wherein the bias adapter is configured to modify the initiating bias signal to establish a substantial tuning range for the fine delay line at operating parameters of supply voltage, temperature, and frequency.

15. The adjustable hybrid delay line of claim 11, wherein the phase generator bias signal comprises an N-channel bias level and the initiating bias signal comprises a P-channel bias level.

16. The adjustable hybrid delay line of claim 11, further comprising a fine phase detector configured to compare a feedback signal and the reference signal to generate the operating bias signal indicating whether the fine delay magnitude should be increased or decreased.

17. The adjustable hybrid delay line of claim 16, wherein the fine phase detector further comprises a loop filter configured to generate the operating bias signal by filtering a fine phase adjustment signal from the fine phase detector.

18. The adjustable hybrid delay line of claim 11, wherein the fine bias generator is configured to be enabled when a loop enable signal is asserted.

19. The adjustable hybrid delay line of claim 11, wherein the fine delay line is configured to be bypassed when a loop enable signal is negated.

20. The adjustable hybrid delay line of claim 11, wherein the fine bias generator is responsive to the initiating bias signal when a fine lock enable signal is negated and responsive to the operating bias signal when the fine lock enable signal is asserted.

21. The adjustable hybrid delay line of claim 11, further comprising a coarse phase detector configured to compare a feedback signal and the reference signal to generate the at least one coarse phase adjustment signal indicating whether the coarse delay magnitude should be increased or decreased.

22. The adjustable hybrid delay line of claim 21, wherein the coarse phase detector is configured to be enabled when a loop enable signal is asserted.

23. A delay locked loop, comprising:
an analog phase generator configured to phase lock to an input signal that is phase related to a reference signal by generating a phase generator bias signal to control a delay magnitude of the analog phase generator;
a coarse loop comprising:
a coarse phase detector configured to compare the reference signal and a feedback signal to generate at least one coarse phase adjustment signal;
a coarse delay line operably coupled to the reference signal and configured to delay a coarse delay output relative to the reference signal by a coarse delay magnitude related to the at least one coarse phase adjustment signal; and
a fine delay line operably coupled to the coarse delay output and configured to delay a delayed output relative to the coarse delay output by a fine delay magnitude related to at least one fine bias signal;
a fine loop comprising:
a fine phase detector configured to compare the reference signal and the feedback signal to generate an operating bias signal;
a fine bias generator configured to control the at least one fine bias signal, wherein the fine bias generator is responsive to either an initiating bias signal related to the phase generator bias signal from the analog phase generator or the operating bias signal; and
the fine delay line; and
a feedback path operably coupling the delayed output to the feedback signal.

24. The delay locked loop of claim 23, wherein the phase generator bias signal, having a P-channel bias level, operably couples to the initiating bias signal.

25. The delay locked loop of claim 24, wherein the analog phase generator is configured to modify the initiating bias signal to establish a substantial tuning range for the fine delay line at operating parameters of supply voltage, temperature, and frequency.

26. The delay locked loop of claim 23, further comprising a bias adapter operably coupled to the phase generator bias signal and configured to generate the initiating bias signal.

27. The delay locked loop of claim 26, wherein the bias adapter is configured to modify the initiating bias signal to establish a substantial tuning range for the fine delay line at operating parameters of supply voltage, temperature, and frequency.

28. The adjustable hybrid delay line of claim 26, wherein the phase generator bias signal comprises an N-channel bias level and the initiating bias signal comprises a P-channel bias level.

29. The delay locked loop of claim 23, wherein the fine phase detector further comprises a loop filter configured to generate the operating bias signal by filtering a fine phase adjustment signal from the fine phase detector.

30. The delay locked loop of claim 23, wherein the fine bias generator is configured to be enabled when a loop enable signal is asserted.

31. The delay locked loop of claim 23, wherein the fine delay line is configured to be bypassed when a loop enable signal is negated.

32. The delay locked loop of claim 23, wherein the fine bias generator is responsive to the initiating bias signal when a fine lock enable signal is negated and responsive to the operating bias signal when the fine lock enable signal is asserted.

33. The delay locked loop of claim 32, wherein the fine lock enable signal is asserted when the coarse loop achieves a phase lock.

34. The delay locked loop of claim 23, wherein the coarse phase detector is configured to be enabled when a loop enable signal is asserted.

35. The delay locked loop of claim 23, wherein the feedback path alternatively comprises a buffer replica configured to emulate a buffer delay, wherein an input of the buffer replica operably couples to the delayed output and an output of the buffer replica operably couples to the feedback signal.

36. A semiconductor device including at least one adjustable analog delay line, the at least one adjustable analog delay line, comprising:
   a fine bias generator configured to control at least one fine bias signal, wherein the fine bias generator is responsive to either an initiating bias signal related to a phase generator bias signal from an analog phase generator, or an operating bias signal;
   a bias adapter operably coupled to the phase generator bias signal and configured to generate the initiating bias signal; and
   a fine delay line including a fine delay input and a delayed output, wherein the fine delay line is configured to delay the delayed output relative to the fine delay input by a fine delay magnitude related to the at least one fine bias signal.

37. A semiconductor wafer, comprising:
   at least one semiconductor device including an adjustable analog delay line, comprising:
      a fine bias generator configured to control at least one fine bias signal, wherein the fine bias generator is responsive to either an initiating bias signal related to a phase generator bias signal from an analog phase generator, or an operating bias signal;
      a bias adapter operably coupled to the phase generator bias signal and configured to generate the initiating bias signal; and
      a fine delay line including a fine delay input and a delayed output, wherein the fine delay line is configured to delay the delayed output relative to the fine delay input by a fine delay magnitude related to the at least one fine bias signal.

38. An electronic system, comprising:
   at least one input device;
   at least one output device;
   a processor; and
   a memory device comprising at least one semiconductor memory including an adjustable analog delay line, comprising:
      a fine bias generator configured to control at least one fine bias signal, wherein the fine bias generator is responsive to either an initiating bias signal related to a phase generator bias signal from an analog phase generator or an operating bias signal;
      a bias adapter operably coupled to the phase generator bias signal and configured to generate the initiating bias signal; and
      a fine delay line including a fine delay input and a delayed output, wherein the fine delay line is configured to delay the delayed output relative to the fine delay input by a fine delay magnitude related to the at least one fine bias signal.

39. A method of generating an analog delay, comprising:
   generating a phase generator bias signal by phase locking an analog phase generator to an input signal phase related to a reference signal;
   joining the phase generator bias signal to an initiating bias signal;
   generating at least one fine bias signal in response to either the initiating bias signal or an operating bias signal; and
   delaying a delayed output relative to an input to a fine delay line by adjusting a fine delay magnitude in relation to the at least one fine bias signal.

40. The method of claim 39, wherein generating the phase generator bias signal establishes a substantial tuning range for the fine delay line at operating parameters of supply voltage, temperature, and frequency.

41. The method of claim 39, wherein joining the phase generator bias signal to the initiating bias signal is performed by an operable coupling.

42. The method of claim 41, wherein the phase generator bias signal comprises a P-channel bias level.

43. The method of claim 39, wherein joining the phase generator bias signal to the initiating bias signal comprises generating the initiating bias signal by buffering the phase generator bias signal.

44. The method of claim 43, wherein the phase generator bias signal comprises an N-channel bias level and the initiating bias signal comprises a P-channel bias level.

45. The method of claim 39, further comprising comparing a feedback signal and the reference signal to generate the operating bias signal indicating whether the fine delay magnitude should be increased or decreased.

46. The method of claim 45, further comprising filtering a fine phase adjustment signal generated by comparing the feedback signal and the reference signal, thereby generating the operating bias signal.

47. The method of claim 39, further comprising enabling the generating at least one fine bias signal when a loop enable signal is asserted.

48. The method of claim 39, further comprising bypassing the fine delay line when a loop enable signal is negated.

49. The method of claim 39, wherein the at least one fine bias signal is generated responsive to the initiating bias signal when a fine lock enable signal is negated and generated responsive to the operating bias signal when the fine lock enable signal is asserted.

50. A method of generating a hybrid delay, comprising:
   delaying a coarse delay output relative to a reference input with a coarse delay magnitude related to at least one coarse delay adjustment signal;
   generating a phase generator bias signal by phase locking an analog phase generator to an input signal phase related to a reference signal;

joining the phase generator bias signal to an initiating bias signal;
generating at least one fine bias signal in response to either the initiating bias signal or an operating bias signal; and
delaying a delayed output relative to the coarse delay output by adjusting a fine delay magnitude in relation to the at least one fine bias signal.

51. The method of claim 50, wherein generating the phase generator bias signal establishes a substantial tuning range for the delayed output at operating parameters of supply voltage, temperature, and frequency.

52. The method of claim 50, wherein joining the phase generator bias signal to the initiating bias signal is performed by an operable coupling.

53. The method of claim 52, wherein the phase generator bias signal comprises a P-channel bias level.

54. The method of claim 50, wherein joining the phase generator bias signal to the initiating bias signal comprises generating the initiating bias signal by buffering the phase generator bias signal.

55. The method of claim 54, wherein the phase generator bias signal comprises an N-channel bias level and the initiating bias signal comprises a P-channel bias level.

56. The method of claim 50, further comprising comparing a feedback signal and the reference signal to generate the operating bias signal indicating whether the fine delay magnitude should be increased or decreased.

57. The method of claim 56, further comprising filtering a fine phase adjustment signal generated by comparing the feedback signal and the reference signal, thereby generating the operating bias signal.

58. The method of claim 50, further comprising enabling the generating at least one fine bias signal when a loop enable signal is asserted.

59. The method of claim 50, further comprising bypassing the delaying a delayed output when a loop enable signal is negated.

60. The method of claim 50, wherein the at least one fine bias signal is generated responsive to the initiating bias signal when a fine lock enable signal is negated and generated responsive to the operating bias signal when the fine lock enable signal is asserted.

61. The method of claim 50, further comprising comparing a feedback signal and the reference signal to generate at least one coarse phase adjustment signal indicating whether the coarse delay magnitude should be increased or decreased.

62. The method of claim 61, further comprising enabling the comparing a feedback signal and the reference signal when a loop enable signal is asserted.

63. A method of generating a delayed output phase locked to a reference signal, comprising:
generating a phase generator bias signal by phase locking an analog phase generator to an input signal phase related to the reference signal;
joining the phase generator bias signal to an initiating bias signal;
comparing a feedback signal and the reference signal to generate at least one coarse phase adjustment signal indicating whether a coarse delay magnitude should be increased or decreased;
delaying a coarse delay output relative to the reference signal with the coarse delay magnitude related to the at least one coarse phase adjustment signal;
comparing the feedback signal and the reference signal to generate an operating bias signal indicating whether a fine delay magnitude should be increased or decreased;
generating at least one fine bias signal in response to either the initiating bias signal or the operating bias signal;
delaying the delayed output relative to the coarse delay output by adjusting the fine delay magnitude of a fine delay line in relation to the at least one fine bias signal; and
completing a feedback loop by operably coupling the delayed output to the feedback signal.

64. The method of claim 63, wherein generating the phase generator bias signal establishes a substantial tuning range for the fine delay line at the operating parameters of supply voltage, temperature, and frequency.

65. The method of claim 63, wherein joining the phase generator bias signal to the initiating bias signal is performed by an operable coupling.

66. The method of claim 65, wherein the phase generator bias signal comprises a P-channel bias level.

67. The method of claim 63, wherein joining the phase generator bias signal to the initiating bias signal comprises generating the initiating bias signal by buffering the phase generator bias signal.

68. The method of claim 67, wherein the phase generator bias signal comprises an N-channel bias level and the initiating bias signal comprises a P-channel bias level.

69. The method of claim 63, further comprising enabling the generating at least one fine bias signal when a loop enable signal is asserted.

70. The method of claim 63, further comprising bypassing the fine delay line when a loop enable signal is negated.

71. The method of claim 63, wherein the at least one fine bias signal is generated responsive to the initiating bias signal when a fine lock enable signal is negated and generated responsive to the operating bias signal when the fine lock enable signal is asserted.

72. The method of claim 63, further comprising enabling the comparing a feedback signal and the reference signal to generate at least one coarse phase adjustment signal when a loop enable signal is asserted.

73. A method of achieving phase lock in a clock system, comprising:
acquiring a phase lock, to a reference signal, in an analog phase generator by adjusting a phase generator bias signal;
joining the phase generator bias signal to an initiating bias signal;
controlling a fine delay magnitude of a fine delay line using the initiating bias signal;
acquiring a coarse phase lock between a feedback signal and the reference signal using a coarse delay line and the fine delay line using the initiating bias signal;
generating an operating bias signal from a fine phase detector by comparing the feedback signal to the reference signal;
switching the controlling the fine delay magnitude from using the initiating bias signal to using the operating bias signal after acquiring the coarse phase lock; and
acquiring a fine phase lock between the feedback signal and the reference signal using the coarse delay line and the fine delay line using the operating bias signal.

* * * * *